United States Patent [19]
Laub

[11] Patent Number: 5,713,744
[45] Date of Patent: Feb. 3, 1998

[54] INTEGRATED CIRCUIT SOCKET FOR BALL GRID ARRAY AND LAND GRID ARRAY LEAD STYLES

[75] Inventor: Michael Frederick Laub, Etters, Pa.

[73] Assignee: The Whitaker Corporation, Wilmington, Del.

[21] Appl. No.: 314,011

[22] Filed: Sep. 28, 1994

[51] Int. Cl.[6] .................................................. H01R 9/09
[52] U.S. Cl. ................................................................ 439/71
[58] Field of Search .......................... 439/66, 71, 91, 439/591, 331, 72, 73

[56] References Cited

U.S. PATENT DOCUMENTS

| | | |
|---|---|---|
| 3,680,032 | 7/1972 | Mosier et al. . |
| 3,740,699 | 6/1973 | Johnson et al. . |
| 3,848,951 | 11/1974 | Michaels et al. . |
| 3,975,076 | 8/1976 | Shida et al. . |
| 3,980,376 | 9/1976 | Rosen . |
| 4,067,637 | 1/1978 | Narozny . |
| 4,129,351 | 12/1978 | Sugimoto et al. . |
| 4,262,981 | 4/1981 | Goodman . |
| 4,343,528 | 8/1982 | Lucius et al. . |
| 4,385,795 | 5/1983 | Endoh et al. . |
| 4,390,220 | 6/1983 | Benasutti ......................... 439/71 OR |
| 4,580,867 | 4/1986 | Wright et al. . |
| 4,585,288 | 4/1986 | Aikens . |
| 4,632,478 | 12/1986 | Kozai et al. . |
| 4,647,124 | 3/1987 | Kandybowski ................... 439/71 OR |
| 4,656,605 | 4/1987 | Clayton . |
| 4,699,593 | 10/1987 | Grabbe et al. .................... 439/71 OR |
| 4,727,513 | 2/1988 | Clayton ............................. 365/52 |
| 4,790,763 | 12/1988 | Weber et al. ...................... 439/65 |
| 4,820,169 | 4/1989 | Weber et al. ...................... 439/65 |
| 4,846,729 | 7/1989 | Hikami et al. .................... 439/161 |
| 4,917,614 | 4/1990 | Kikuchi et al. ................... 439/83 |
| 4,969,842 | 11/1990 | Davis ................................ 439/629 |
| 4,990,107 | 2/1991 | Fortuna ............................. 439/637 |
| 4,998,886 | 3/1991 | Werner ............................. 439/66 |
| 5,057,032 | 10/1991 | Kaufman et al. ................ 439/326 |
| 5,082,459 | 1/1992 | Billman et al. ................... 439/637 |
| 5,104,324 | 4/1992 | Grabbe et al. .................... 439/62 |
| 5,197,891 | 3/1993 | Tanigawa et al. ................ 439/83 |
| 5,199,889 | 4/1993 | McDevitt, Jr. ................... 439/71 X |
| 5,216,583 | 6/1993 | Katsumata ........................ 439/71 X |
| 5,233,451 | 8/1993 | Iguchi .............................. 359/88 |
| 5,259,793 | 11/1993 | Yamada et al. .................. 439/637 |
| 5,259,795 | 11/1993 | Yamada et al. .................. 439/751 |
| 5,263,870 | 11/1993 | Billman et al. .................. 439/108 |
| 5,344,334 | 9/1994 | Laub et al. ....................... 439/331 |

*Primary Examiner*—P. Austin Bradley
*Assistant Examiner*—Daniel Wittels
*Attorney, Agent, or Firm*—June B. Schuette; Robert J. Kapalka

[57] ABSTRACT

Injection molded insulating strips receive a plurality of contacts. The strips are stacked together to create a multiple row, multiple column contact array. The contact array is adapted for use in an IC socket to separably connect an IC having either an LGA or BGA package lead styles. A cover plate, locator, array frame, and contact array together comprise a manufacturable and low cost separable IC socket.

8 Claims, 10 Drawing Sheets

INTEGRATED CIRCUIT SOCKET FOR BALL GRID ARRAY AND LAND GRID ARRAY LEAD STYLES

FIELD OF THE INVENTION

The invention relates to integrated circuit sockets, and more specifically to an integrated circuit socket for integrated circuit packages utilizing land grid array or ball grid array lead styles.

BACKGROUND

Some of the more recent integrated circuit ("IC") package designs, which are enhancements to Pin Grid Array ("PGA") package styles, include Land Grid Array ("LGA") styles and Ball Grid Array ("BGA") styles. A PGA package style is an N row by M column grid of pins which act as electronic leads for the integrated circuit. A PGA package style is limited in that it is intended for through hole soldering to a printed circuit board ("PCB") which uses more of the available space on a PCB than surface mount soldering. In order to take advantage of the higher densities available with surface mount soldering, the industry is investigating use of the LGA and BGA package styles. The LGA package style comprises an array of planar, typically rectangular or circular, pads located on an underside of the IC package for surface contact with leads on a PCB. The BGA package style comprises an array of semispherical solder balls similarly located on an underside of the IC package for surface contact with leads on a PCB. The array of either pads, in the case of the LGA or balls in the case of the BGA, is typically in a multiple row, multiple column arrangement creating a matrix of surface contacts.

As the LGA/BGA package styles are relatively new, manufacturers are reluctant to convert to these package styles in high volume applications without a certain degree of confidence that they will work in a larger system. During evaluation and testing of new ICs and IC package styles, manufacturers wish to have an IC socket to provide a separable interconnect to test different ICs. During evaluation and testing, modifications are made and needs change. Some modifications require a new socket. If tooling for a new socket is costly, so is the new socket, particularly in low volume. Costly changes increase the cost of evaluating new ICs. If the evaluation cost is high, either the evaluation and hence the upgrades occur more infrequently or the cost of the evaluation is passed on to the consumer as a higher price for new systems. Socket applications include IC prototyping, IC functional test, and burn-in, as well as production applications. There is a need, therefore, for a low cost socket that provides a separable interconnect between an IC and PCB.

A known socket providing a separable interconnect for an LGA package style having an advantageously low profile is disclosed in U.S. Pat. No. 5,344,334 entitled "Hinged Cover For An Electrical Socket" assigned to the present assignee. The IC socket disclosed therein comprises socket 10, hinged cover 14, and contact member 30. The contact member comprises a series of compressible interconnects thereon. In order to effect electrical interconnection between LGA pads on the socketed IC and pads on a PCB substrate directly, the contact member is compressed between the IC and the PCB. The contact member disclosed, while highly effective and advantageously having a low profile, is expensive to manufacture and must be modified according to differing row and column configurations of the IC housed by the socket.

There is, therefore, a need to have a low cost, low profile IC socket for LGA and BGA IC package lead styles.

One of the more expensive parts to manufacture for the low profile socket disclosed in U.S. Pat. No. 5,344,334 is contact member 30. Modifications that require a change to the IC package column and row configuration mandate a change to the socket column and row configuration. Column and row configuration changes of the contact member increase the manufacturing cost of the socket. A configurable contact member permitting tooling costs to be amortorized over a large volume would reduce the manufacturing cost. In addition, the contact member should lend itself well to automated manufacturing and assembly to further reduce the manufacturing costs. There is a need, therefore, for a configurable contact member for use in an IC socket providing a separable interconnect.

SUMMARY

It is an object of the present invention to provide a configurable high density dual compressive contact array. It is an object of the present invention to provide a contact array for use with high density PCB surface contacts. It is an object of the present invention to provide a highly manufacturable separable interconnect IC socket for high density ICs.

A contact strip comprises a rectangular strip of insulating material having first and second parallel sides and a plurality of cavities. It is a feature of the invention that a cavity receives a contact, the contact being positioned within the strip at a nonperpendicular angle with respect to the first and second parallel sides. It is an advantage of the invention that the angle of position of the contact within the strip provides for receipt of a contact having a beam of sufficient compliance to maintain a high quality separable electrical connection while permitting close contact spacing.

A contact array comprises a plurality of stacked insulating strips, each said strip having a plurality of retention cavities. The contact array also comprises a plurality of contacts, each contact being received by a retention cavity. It is a feature of the present invention that contact strips may be stacked to create a contact array. It is an advantage of the present invention that any number of contact strips may be selected to comprise the stack to create an application specific number of rows and columns within the contact array.

An IC socket comprises an array frame and a cover therefor. A contact array is received by the array frame. The contact array comprises a plurality of stacked insulating strips. Each strip has a plurality of retention cavities. The contact array also comprises a plurality of contacts and each contact is received by a retention cavity. It is a feature of the present invention that contact strips may be chosen and cut according to IC pitch and number of leads to create a configurable contact array for use in an IC socket. A contact array that may be configured from existing standard parts provides for fewer required tooling changes to generate IC socket modifications. Fewer tooling changes provides for faster vendor response to customers and their changing needs as well as lower manufacturing costs due to amortization of the manufacturing costs over large volumes.

In a preferred aspect of the invention, the contact strip receives a contact comprising a base having two contact legs and a retention arm extending therefrom. It is a feature of the present invention that the retention cavity receives the retention arm in an interference fit. It is an advantage of the invention that receipt of a retention arm in an interference fit may be beneficially adapted to automated assembly.

BRIEF DESCRIPTION OF THE DRAWINGS

FIG. 3 is an three dimensional view of a contact strip.

DETAILED DESCRIPTION OF THE PREFERRED EMBODIMENT

Figure 1:
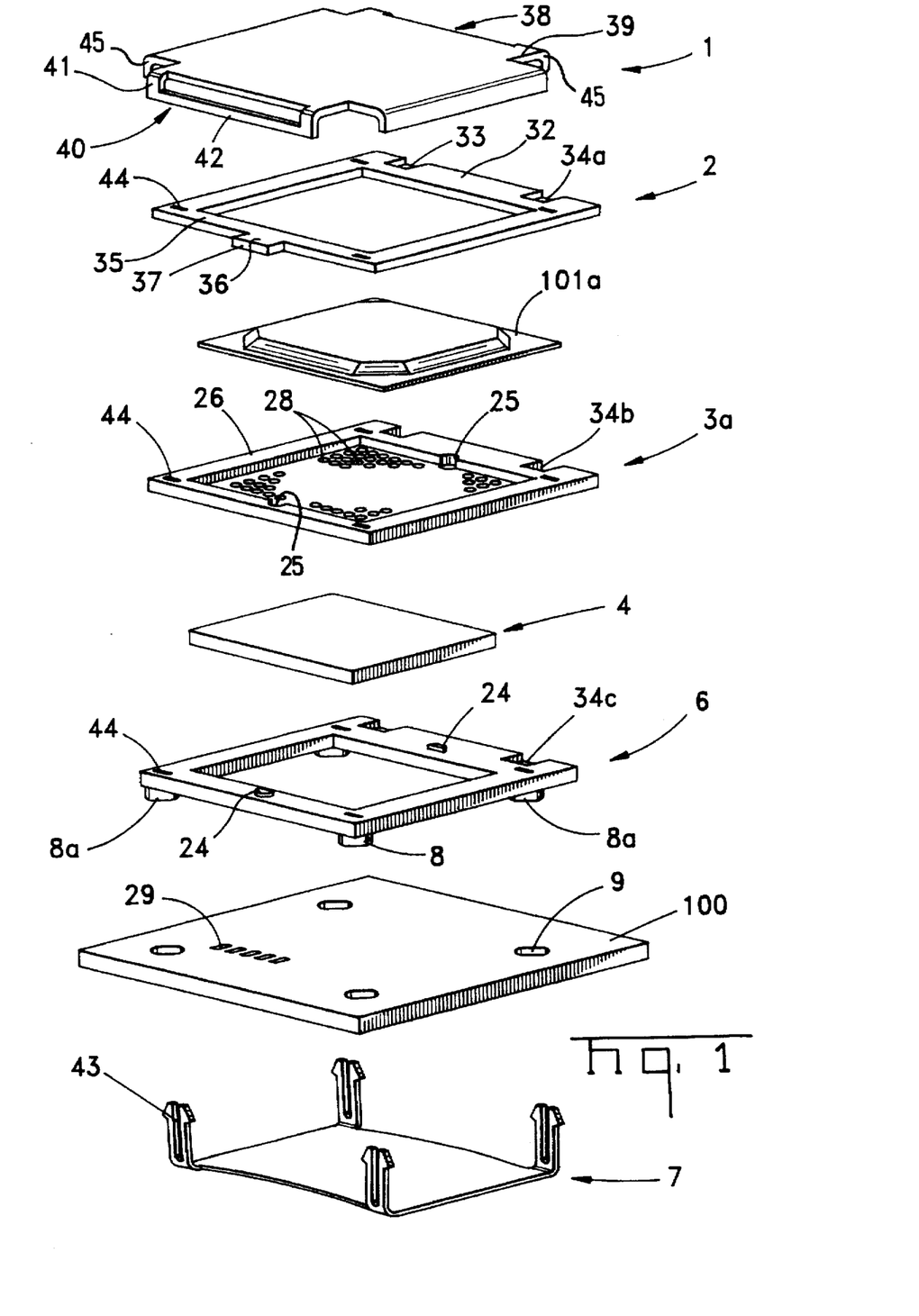
FIG. 1 is an exploded perspective view of an IC socket illustrating an application of the present invention using the BGA locator.
Figure 2:
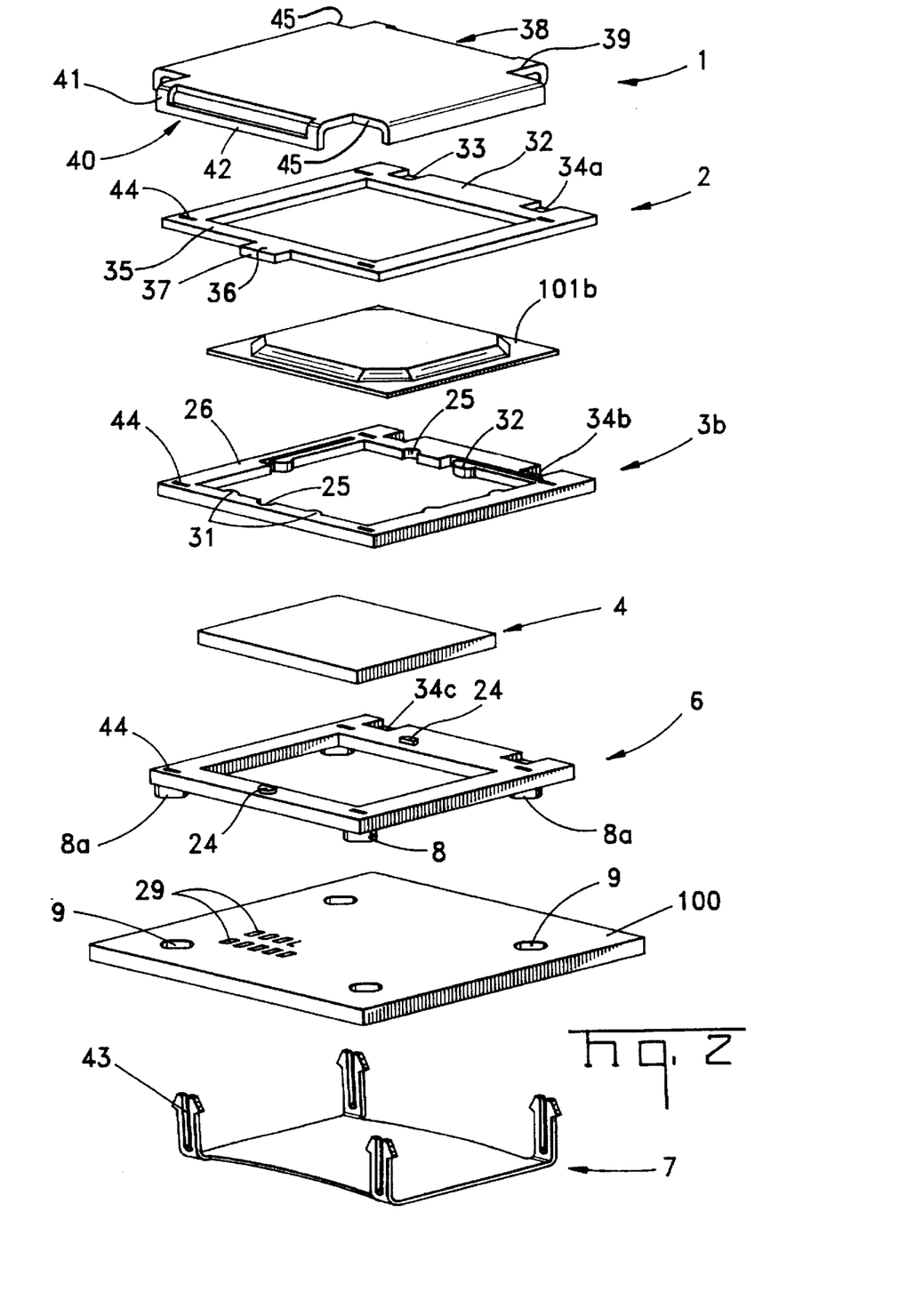
FIG. 2 is an exploded perspective view of an IC socket illustrating an application of the present invention using the LGA locator.

With reference to FIGS. 1 and 2, a low profile IC socket adapted to receive either an LGA or BGA IC package lead style comprises cover plate 1, cover frame 2, locator 3a, 3b, contact array 4 having contacts 5 therein, array frame 6, and back up plate 7. In operation, the array frame 6 mounts onto PCB 100. Four bosses 8 at each corner of the array frame 6 fit within holes 9 on the PCB 100. The holes 9 are at each of the four corners defining a general area that encloses the pads to which an LGA or BGA connect. Two alignment bosses 8a on diagonal corners of the array frame 6 serve to accurately align the array frame 6 relative to the pads 29 on the PCB 100. The remaining two diagonal bosses have a looser clearance tolerancing for ease of array frame 6 insertion to the PCB 100. The contact array 4 fits within the array frame 6. Each of four interior sides 10 of the array frame 6 are appropriately sized to receive and engage each of four exterior sides 11 of the contact array 4. Engagement of the interior sides 10 to the exterior sides 11 effect proper relationship between the contact array 4 and the bosses 8. Proper relationship between the holes 9 and the pads 29, therefore, effect alignment between the pads 29 and the contact array 4.

Figure 4:
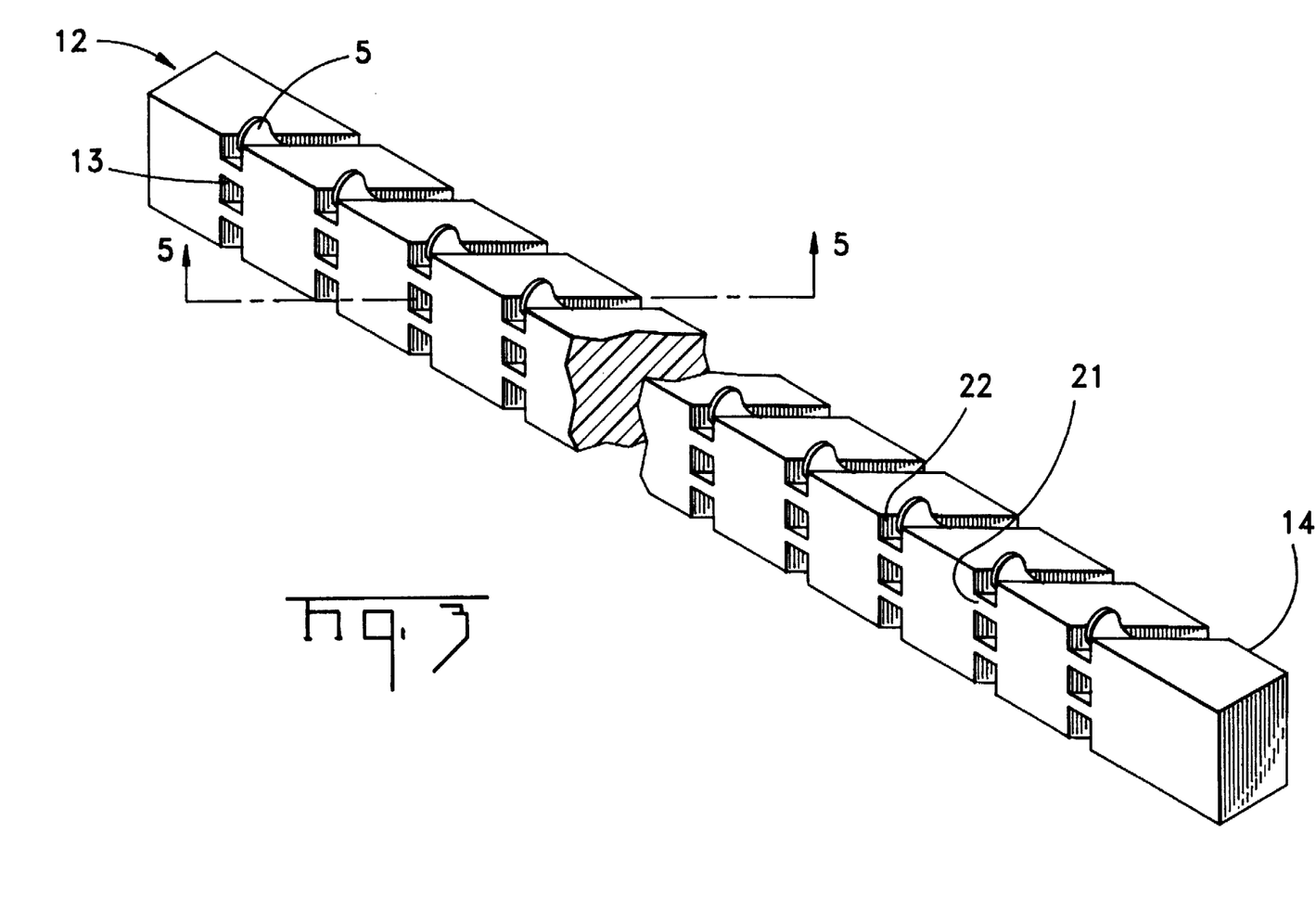
FIG. 4 is an three dimensional view of a stack of contact strips forming a contact array.

With reference to FIGS. 3 and 4, the contact array 4 comprises a stack of rectangularly shaped injection molded strips 12 of insulating material, preferably liquid crystal polymer. Each strip 12 is manufactured having thirty cavities 13 along its length.

Each cavity 13 receives a single contact 5. The cavities 13 are positioned 45 degrees with respect to a receipt side 14 of the contact strip 12. There are three different varieties of strips 12; a 1 mm pitch, 0.050 inch pitch, 0.060 inch pitch which include three of the more popular lead pitches for LGA and BGA IC lead styles. The present invention does not preclude strips of varying pitches different from those herein disclosed. The contact strips 12, with contacts 5 retained therein, stack horizontally to create a contact array 4. The contact strips 12 are chosen according to the desired pitch and are cut according to the desired number of positions. Some number of the chosen and modified strips 12 stack to ether to create the multiple row by multiple column contact array 4 according to a specific need.

Figure 5:
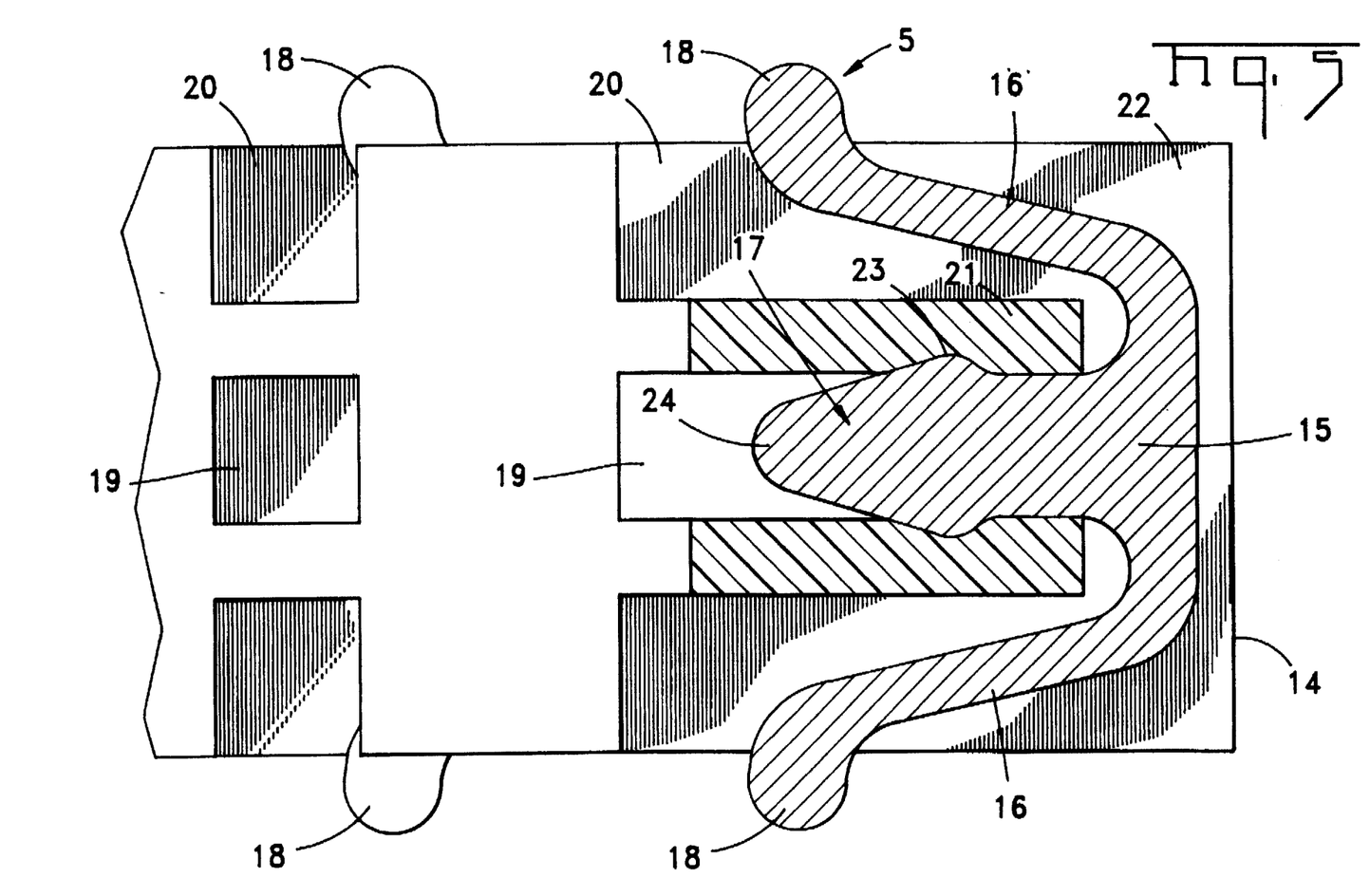
FIG. 5 is a cross sectional view of a retention cavity receiving a contact.

With reference to FIG. 5, each cavity 13 within the strips 12 is further defined by two separators 21 perpendicularly positioned relative to and joining two walls 22. The separators 21 extend partially through the width of the strip 12. The separators 21 and walls thusly joined define three channels of the cavity 13; a retention channel 19 and two contact channels 20. Each channel 19, 20 is rectangularly shaped.

Each cavity 13 receives one of the contacts 5. The contact 5 is substantially epsilon shaped, comprising a base 15 from which extends two contact legs 16 and a retention arm 17. The contacts 5 are stamped from a conducting metal, preferably beryllium copper. The retention arm 17 is positioned between the contact legs 16. The retention arm 17 has an enlargement 23 at approximately the middle of the retention arm 17 and a taper 24 distal from the base 15. The contact leg 16 is a beam having a cross section of uniform width and a tip 8 extending outwardly of the strip 12 when the contact is received within the retention cavity 13. The retention channel 19 receives the retention arm 17 therewithin. The taper 24 provides a lead in for guidance of retention arm 17 into the retention channel 19. Upon full seating of the retention arm 17 within the retention channel 19, the enlargement 23 engages the separators 21 in an interference fit, retaining it therein. Single axis insertion of the contact 5 within the strip 12 and the presence of the taper 24 provides for beneficial application of automated assembly processes in manufacturing of the strips 12. When the retention arm 17 is fully seated within the retention channel 19, each contact channel 20 receives each contact leg 16. The base 15 is received by the cavity 13 and is insulated from adjacent contacts by the walls 22 separating them. The base 15 is received so that it does not extend past the outer surfaces of the strip 12 and is received within the retention cavity 13 having some clearance between the base and the end of the strip. The clearance provides for insulation between contacts 5 in adjacent stacked strips 12. The two contact tips 18 extend outwardly of the strip 12. The contact legs 16 are compliant by virtue of the material comprising them and the shape and length of the beams. The separators 21 are appropriately sized providing a clearance for the contact legs 16 to cantilever independently upon the application of a force normal to the contact tip 18. The walls 22 aid in directing movement of the contact legs responsive to a normal force applied thereto. The shape of the contact 5 and the cavity 13 lends itself to automated stamping of the contact 5 and automated insertion of the contact into the strip 12.

Figure 6:
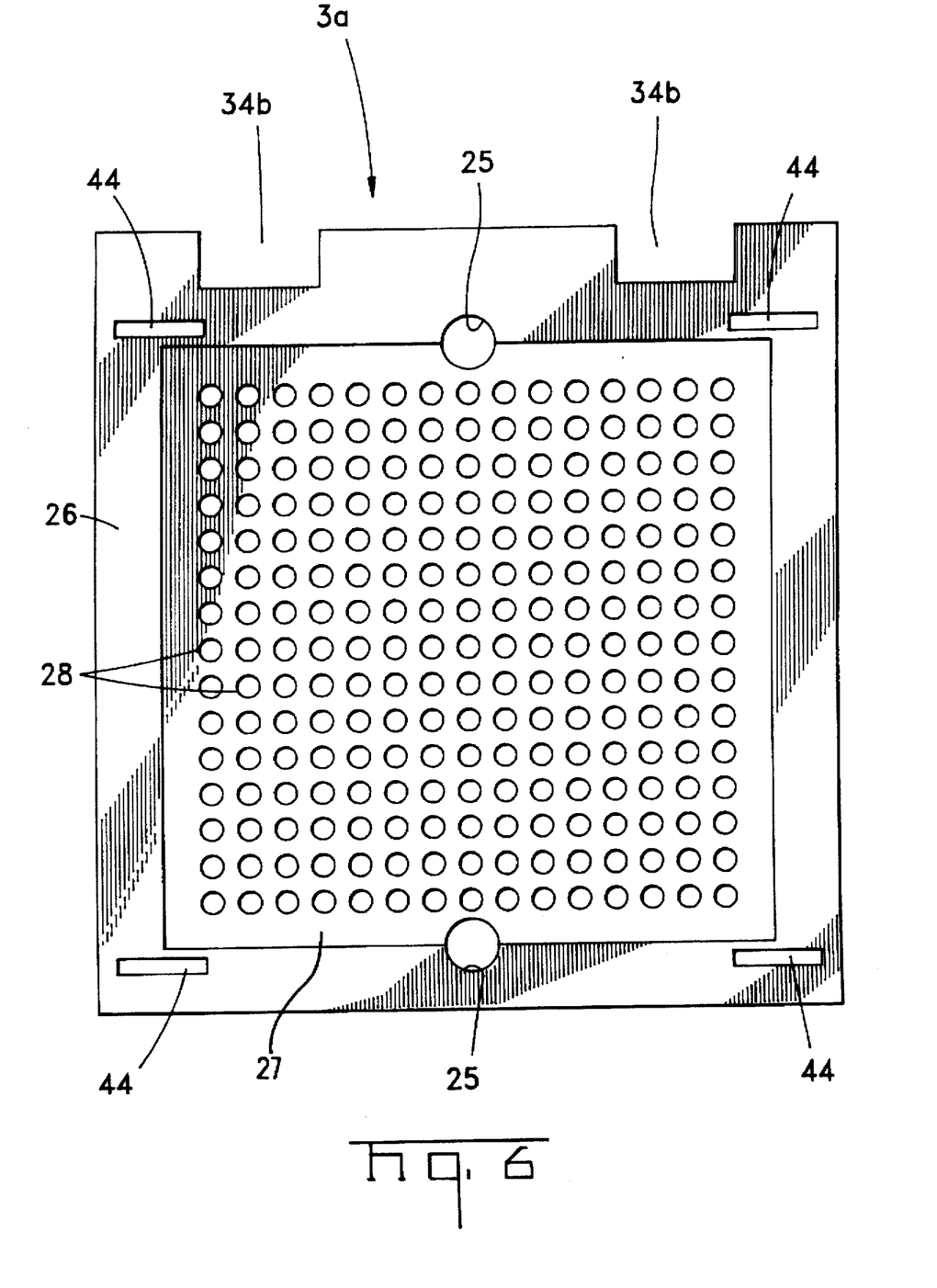
FIG. 6 is a plan view of the BGA locator.

The locator is sandwiched between the cover frame 2 and the array frame 6. One embodiment of the locator is adapted for use with the BGA IC 101a package lead style. With reference to FIG. 6, the BGA locator 3a comprises a BGA locator frame 26 and a locator nest 27. The B GA locator nest 27 comprises a plate having pockets 28. The pockets 28 correspond to semispherical solder balls indicative of the BGA IC package style. The pockets 28 receive the BGA leads and register the leads over the contact tips 18 extending from the contact array 4. There is the additional advantage of the pockets 28 surrounding the solder ball leads in that the pockets 28 serve to resist extreme deformation of the ball over time. The contact tips 18 of the contact array 4 exert a normal force on each solder ball lead under normal operation of the socket. The pockets 28 contain the ball within a specific volume which assures physical contact of the solder ball to the contact tip and a consistent electrical connection over time.

Figure 7:
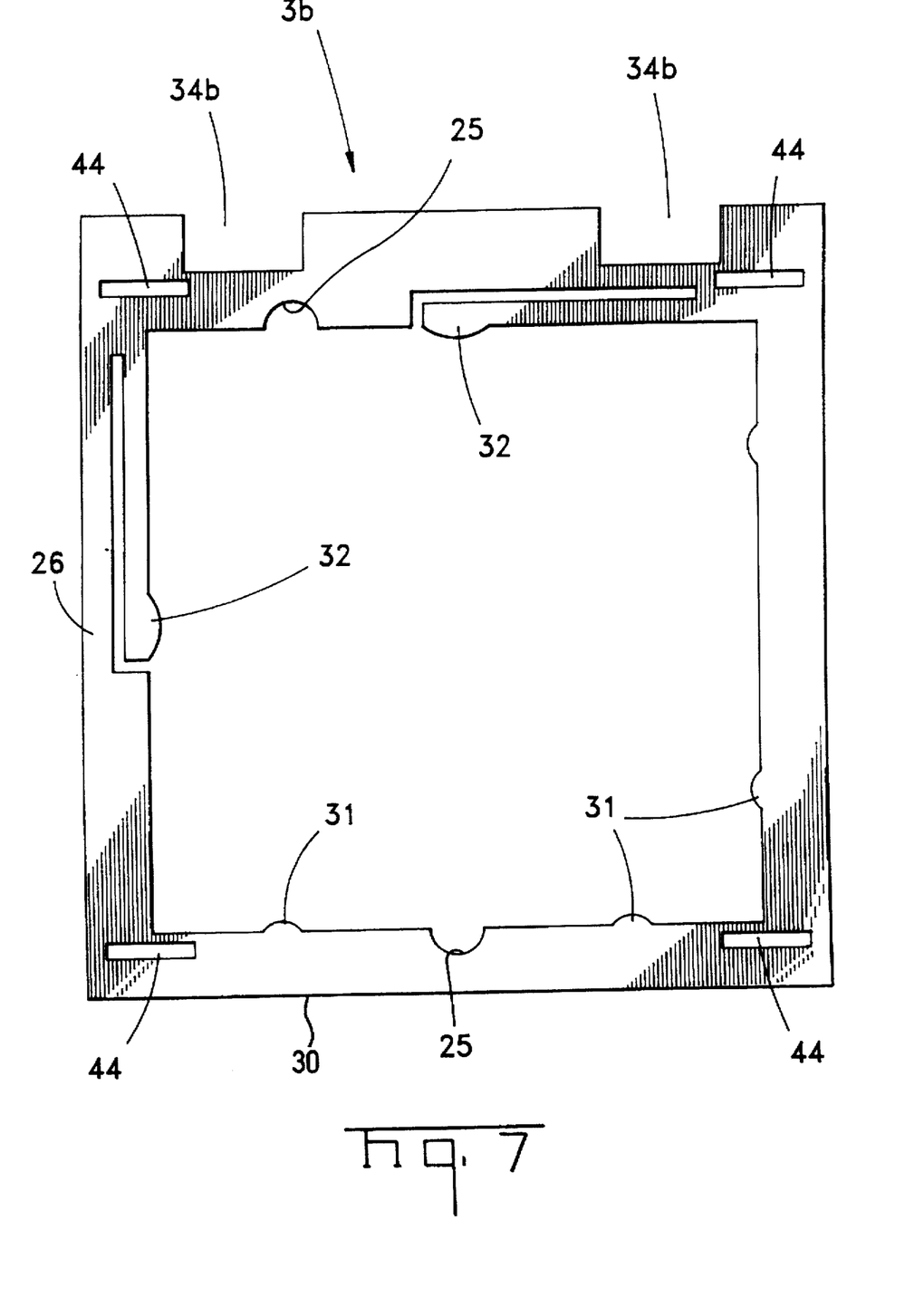
FIG. 7 is a plan view of the LGA locator.
Figure 8:
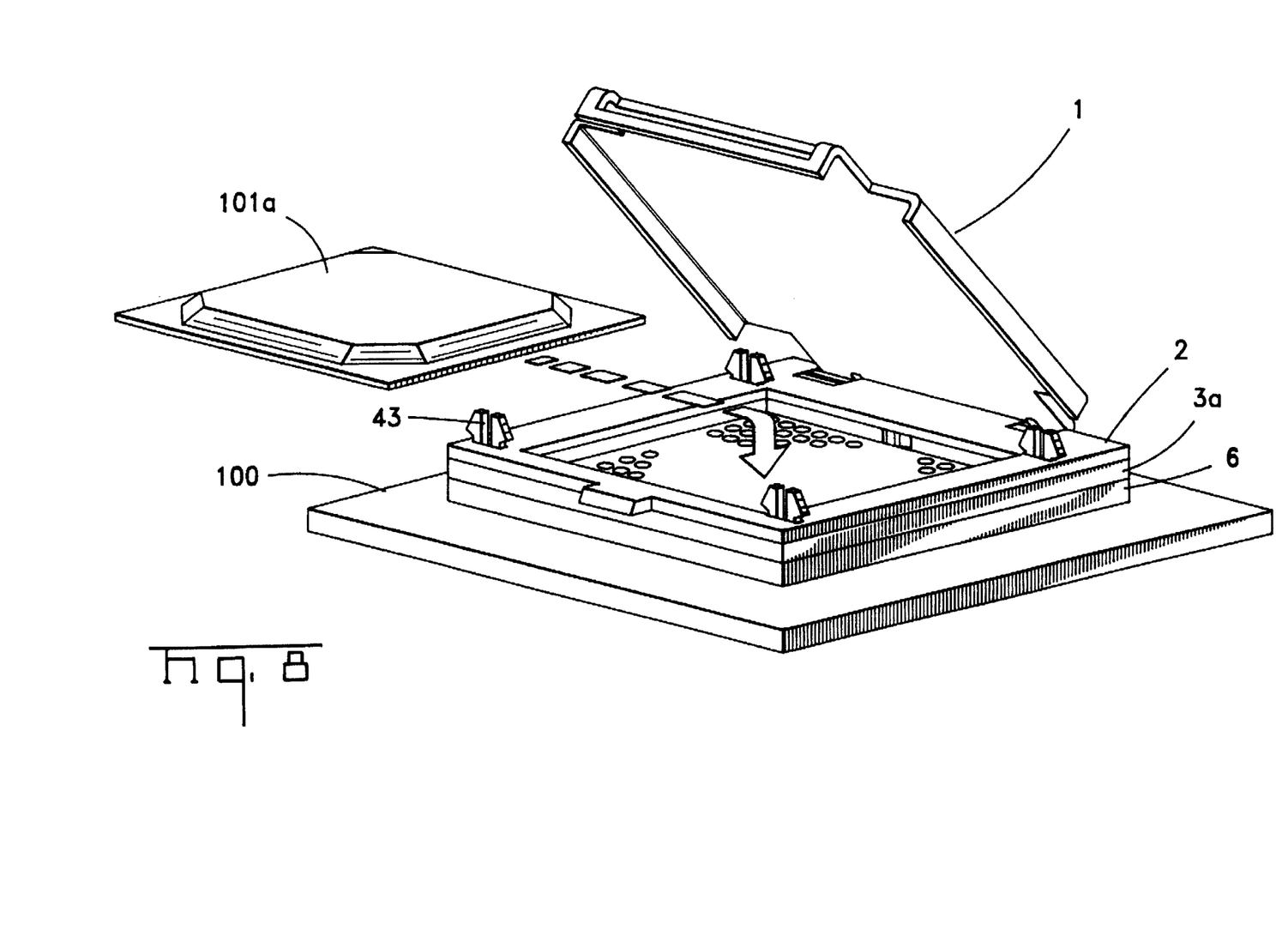
FIG. 8 is an three dimensional view of an assembled socket ready for receipt of an IC having a BGA lead style.
Figure 9:
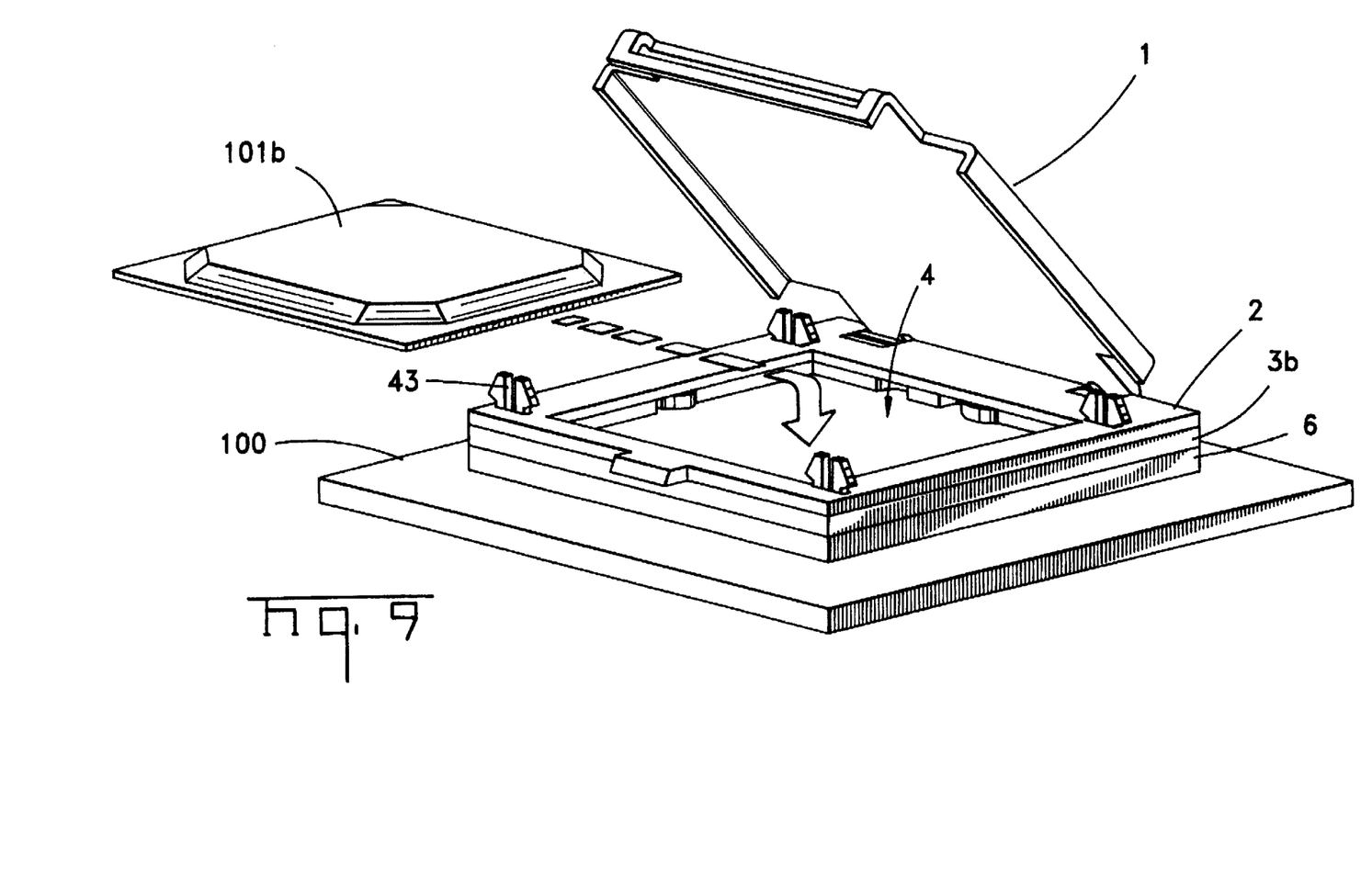
FIG. 9 is an three dimensional view of an assembled socket ready for receipt of IC having an LGA lead style.
Figure 10:
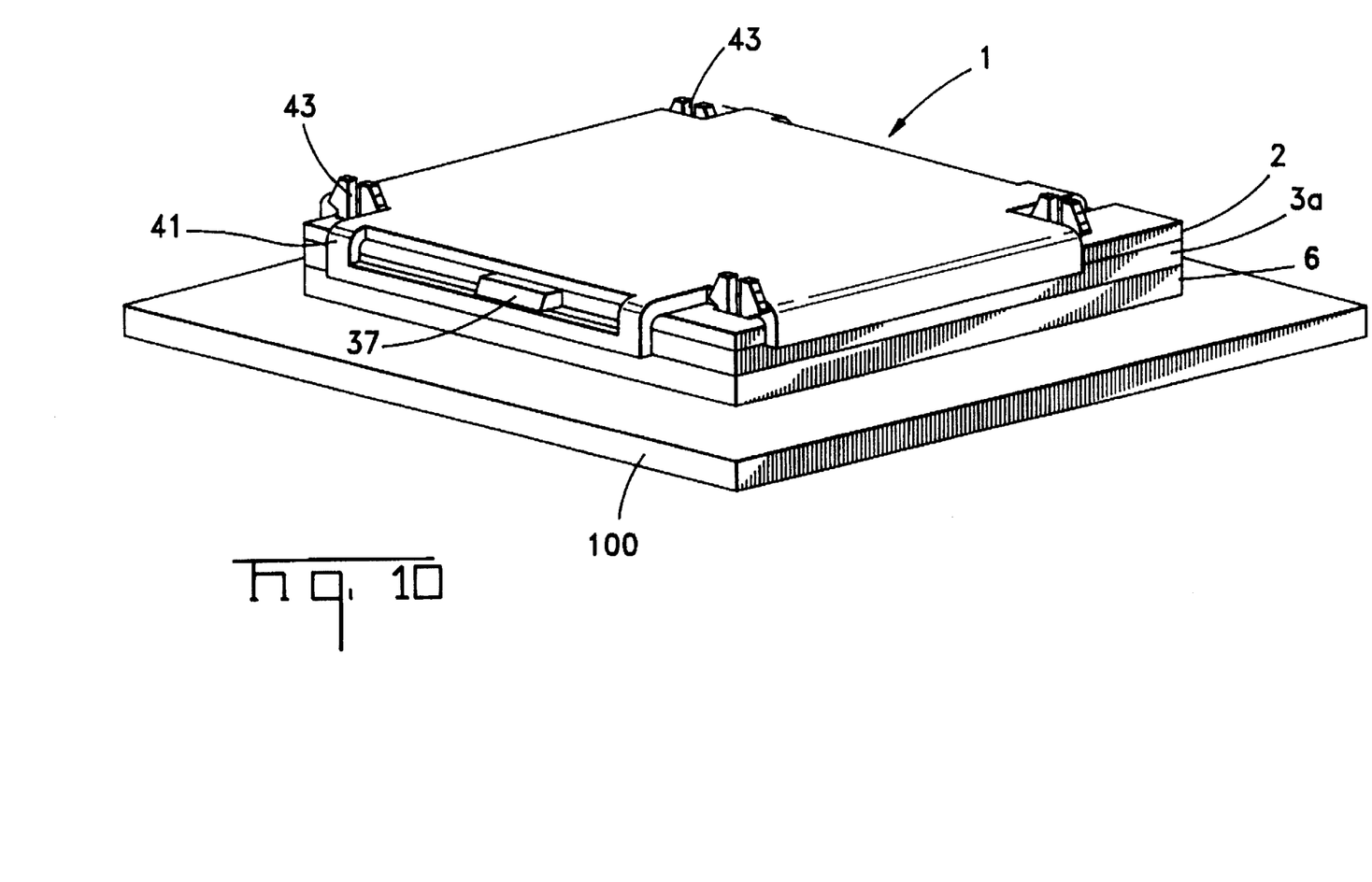
FIG. 10 is an three dimensional view of an assembled and closed socket shown with respect to a PCB substrate.

Another embodiment of the locator is adapted for use with the LGA IC 101b package lead styles. With reference to FIG. 7, the LGA locator 3b comprises an LGA locator frame 30 having two datum 31 on first adjacent side pairs and a biasing element 32 on each side of second adjacent side pairs. The datum 31 accurately register two sides of the LGA IC 101b. The biasing elements assure abutting relation between the two sides of the LGA IC 101b and all datum 31. The abutting relation between two sides of the LGA IC 101b and the datum 31 assure proper registration between the LGA IC 101b and the LGA locator 3b. Locators 3a and 3b are injection molded and are preferably made of liquid crystal polymer.

The array frame 6 has registration elements 24 thereon. With reference to FIGS. 1 and 2, the registration elements 24 comprise two pins, one each on an upper surface of opposite sides of the array frame 4. Both the BGA locator 3a and the LGA locator 3b have registers 25 complementary to the registration elements 24. The registers 25 comprise two circular holes corresponding to the registration element 24 pegs. One registration element 24 is circular. Another registration element 24 is circular with two opposing chords. The registration elements 24 fit within the registers 25 to properly register the locator 3a, 3b with respect to the array frame 4. In this way, as the array frame 6 receives the contact array 4, proper registration is made between the locator 3a, 3b relative to the contact array 4 and therefore the contacts 5.

The cover plate 1 and cover frame 2 are substantially similar in all material aspects to U.S. Pat. No. 5,344,334 entitled "Hinged Cover For An Electrical Socket", the disclosure of which is hereby incorporated by reference. The cover frame 2 comprises four sides perpendicular to each other. A cover frame hinge side 32 has two bars 33 incorporated therein. On each bar at an outwardly facing edge of the cover frame hinge side 32, there is a cover frame hinge recess 34a. A cover frame latch side 35, which in a preferred embodiment is opposite the cover frame hinge side 32, has a cover frame latch member 36 incorporated therein. The cover frame latch member 36 has a slope 37 on an outwardly facing edge.

The cover plate 1 comprises a flat plate with four sides angled at right angles with respect to the plane defined by the flat plate. A cover plate hinge side 38 has two substantially J-shaped hinges 39. The hinges 39 are adapted to engage the bars 33 on the cover frame hinge side 32. Hinge recesses 34b are in the locator 3a,3b and hinge recesses 34c are in the array frame 6. All of the hinge recesses 34a, 34b, 34c permit the hinges 39 to move freely around the bars 33 allowing the cover plate 1 of the socket to open and close. A cover plate latch side 40 has cover plate latch member 41 incorporated therein. Cover plate latch member 41 is adapted to engage cover frame latch member 36. As cover plate 1 closes over the socket, cover plate latch member 41 engages slope 37. Slope 37 urges cover plate latch member 41 outwardly to pass over cover frame latch member 36. As cover plate latch member 41 passes over cover frame latch member 36, cover plate latch member 41 retracts to its unbiased position. Lip 42 engages the underside of cover frame latch member 36 retaining the cover plate 1 to the cover frame 2.

Back up plate 7 comprises a substantially planar member having four lock springs 43. The back up plate 7 provides stability for the PCB 100 and is used as a reaction surface to forces exerted by IC leads in response to normal forces exerted on the IC 101a,101b by the socket. There is one lock spring 43 located at each of four corners of the back up plate. In an embodiment of the back up plate, the substantially planar member has a reverse bow. Bowing of the backup plate provides for counteraction of the normal forces exerted by the IC as compressed by the socket on the PCB substrate.

The cover frame 2, the locator 3a,3b, and the array frame 6 have slots 44 at each of four corners to receive the lock springs 43. The lock springs 43 are conventional in the art and comprise opposing resilient beams, each beam having an outwardly facing barb thereon. Compression of the beams toward each other permit each lock spring 43 to pass through the slot 44. Release of the lock springs after passage, permits the barbs to engage a rim of the slot 44 resisting egress of the lock spring 43. The lock springs 43 serve to maintain assembly of the socket and hold the socket to the PCB 100. The slots 44 in the array frame 6 are positioned centrally through the alignment bosses 8. The alignment bosses 8 therefore serve the function of aligning the array frame over the pads 29 on the PCB 100 as well as providing an area for receiving the lock springs 43. In this way, the assembly feature does not add appreciably to socket footprint as alignment and mounting coexist in space, even though they are separate in function. The cover plate 1 has four clearances 45 at each of the four corners. The clearances 45 provide for full receipt of the lock springs 43 by the socket and permit the cover plate 1 to engage and disengage the cover frame 2.

I claim:

1. An integrated circuit socket for interconnecting an integrated circuit to a circuit board substrate, the socket comprising:
   an array frame;
   a contact array received in said array frame, the contact array comprising:
      a plurality of stacked insulating strips, each said strip having a plurality of retention cavities, and a plurality of contacts disposed within respective ones of said cavities; and
   a locator disposed above said array frame, the locator having a plurality of circular pockets for receiving a plurality of leads of the integrated circuit and registering the leads with respective ones of the contacts.

2. The integrated circuit socket according to claim 1, wherein the locator has first and second opposing sides, the first side having two datum and the second side having a biasing element.

3. The integrated circuit socket according to claim 1, wherein the locator has first and second adjacent side pairs, each side of said first pair has two datum thereon, and each side of said second pair has a biasing element thereon.

4. The integrated circuit socket according to claim 1, wherein said locator has a registration element cooperating with a register on said array frame.

5. The integrated circuit socket according to claim 1, further comprising a back-up plate having at least two lock springs, said back-up plate and said array frame configured to reside on opposite sides of said substrate with said lock springs extending through said substrate and said array frame.

6. The integrated circuit socket according to claim 5, wherein said array frame has bosses that align said frame to said substrate, and said lock springs extend through the bosses.

7. The integrated circuit socket according to claim 6, wherein said back-up plate has a reverse bow.

8. The integrated circuit socket according to claim 1, further comprising a cover disposed above said locator for protecting said integrated circuit.

* * * * *